United States Patent [19]

Sundaresan

[11] Patent Number: 5,347,152

[45] Date of Patent: Sep. 13, 1994

[54] STACKED CMOS LATCH WITH CROSS-COUPLED CAPACITORS

[75] Inventor: Ravishankar Sundaresan, Garland, Tex.

[73] Assignee: Texas Instruments Incorporated, Dallas, Tex.

[21] Appl. No.: 156,992

[22] Filed: Nov. 23, 1993

Related U.S. Application Data

[63] Continuation of Ser. No. 811,891, Dec. 19, 1991, abandoned, which is a continuation of Ser. No. 373,745, Jun. 30, 1989, abandoned.

[51] Int. Cl.$^5$ .................. H01L 27/10; G11C 11/34
[52] U.S. Cl. .................. 257/304; 257/305; 257/296; 257/300; 365/182
[58] Field of Search .................. 357/23.6, 51, 42, 41; 257/304, 305, 296, 300; 365/182, 185

[56] References Cited

U.S. PATENT DOCUMENTS

| | | | |
|---|---|---|---|
| 4,622,571 | 11/1986 | Hara | 357/42 |
| 4,654,121 | 3/1987 | Miller et al. | 357/42 |
| 4,771,323 | 9/1988 | Sasaki | 357/23.6 |
| 4,839,707 | 6/1989 | Shields | 357/23.6 |
| 4,849,801 | 7/1989 | Honjyo et al. | 357/51 |
| 4,888,631 | 12/1989 | Azuma et al. | 357/23.6 |
| 4,901,124 | 2/1990 | Seki | 357/42 |
| 4,924,278 | 5/1990 | Logie | 351/23.6 |
| 5,016,070 | 5/1991 | Sundaresan | 357/23.6 |

FOREIGN PATENT DOCUMENTS

| | | |
|---|---|---|
| 62-179143 | 8/1987 | Japan . |
| 62-206872 | 9/1987 | Japan . |
| 62-290176 | 12/1987 | Japan . |
| 63-29965 | 2/1988 | Japan . |
| 1-145850 | 6/1989 | Japan . |

*Primary Examiner*—Viet Q. Nguyen
*Attorney, Agent, or Firm*—Jacqueline J. Garner; Richard L. Donaldson; William E. Hiller

[57] ABSTRACT

A latch (80) utilizing stacked MOS technology is provided. Latch (80) is formed generally in relation to a semiconductor substrate (82). An N channel transistor is provided with first and second diffused regions (96 98) and a gate conductor (86). A P channel transistor is provided with first and second doped regions (106, 110) having a channel region (108) therebetween. The second diffused region (98) of the N channel transistor also functions as the gate conductor for the P channel transistor. A capacitive element exists by having an insulating layer (84) or layers (84, 100) between first doped region (104) and second diffused region (98).

10 Claims, 2 Drawing Sheets

STACKED CMOS LATCH WITH CROSS-COUPLED CAPACITORS

This application is a continuation of application Ser. No. 07/811,891, filed Dec. 19, 1991, which is a continuation of application Ser. No. 07/373,745, filed Jun. 30, 1989, now abandoned.

RELATED APPLICATION

This application is related to co-pending Application for U.S. Pat. No. 07/373,746, filed Jun. 30., 1989, entitled "Stacked CMOS Latch Cell Having Trench Transistors and Cross-Coupled Capacitors," by Sundaresan, incorporated herein by reference.

TECHNICAL FIELD OF THE INVENTION

This invention relates in general to transistor latch technology, and more particularly to a stacked CMOS transistor configuration having cross-coupled capacitors therein to form a latch circuit.

BACKGROUND OF THE INVENTION

As SRAM densities increase, it is becoming increasingly necessary to find alternative ways to obtain smaller SRAM cells. Stacked CMOS technology in which the P channel load is stacked on top of an N channel bulk transistor is being utilized for building 4 megabit memories and beyond. As the device geometry decreases, each cell therein becomes susceptible to soft radiation errors. As a result, it is imperative to utilize capacitors at the sensitive nodes to maintain charges which otherwise would be affected by exposure to soft radiation.

Under an existing stacked CMOS technology known as merged CMOS (MCMOS), a stacked CMOS latch is constructed with a single polysilicon layer overlying a bulk P type substrate. As a result, the source and drain regions of the underlying N channel transistor are not self-aligned to the gate electrode of the transistor. Further, the gate oxide for both the N channel and P channel transistors comprises the same oxide layer and, as a result, must necessarily be of the same thickness for both transistors limiting the functionality of the transistors. Additionally, under the current art, there are no provisions for a stacked capacitor within the SRAM configuration.

Therefore, a need has arisen for a stacked CMOS cell which includes therein a stacked capacitive element to reduce susceptibility to soft radiation exposure. There also exists a need for the stacked cell to utilize self-aligned source/drain regions with the underlying N-channel transistor. Finally, there is an additional need to provide independent gate oxides for the buried N channel transistor and overlying P channel transistor.

SUMMARY OF THE INVENTION

In accordance with the present invention, a transistor cell is provided which substantially eliminates or reduces disadvantages associated with prior transistor cell configurations.

The transistor cell of the present invention generally includes a bulk transistor adjacent a stacked transistor. Further included within the present invention is a stacked capacitive element having first and second opposing plates, the first plate electrically coupled to the gate of the bulk transistor and the second plate electrically coupled to the gate of the stacked transistor. In the preferred embodiment, the bulk transistor is an N channel transistor while the stacked transistor is a P channel transistor. The transistors of the present invention are constructed in relation to a semiconductor substrate with various diffused regions therein. A single diffused region within the semiconductor substrate may be operable as the gate of the P channel transistor, a plate of the capacitive element, and one of the source/drain regions of the N channel transistor.

The present invention provides the technical advantage of a stacked configuration, thereby minimizing cell dimensions and giving rise to larger packing densities. Further, the inclusion of capacitors within the cell provides the technical advantage of reduced cell susceptibility to soft radiation errors. Another technical advantage of the present invention includes independent gate oxides between the gates and the channels of each of the transistors therein. The independent gate oxides give rise to the technical advantages of increased gate oxide integrity and selective threshold voltages for each independent transistor. Further, there is the technical advantage of selective capacitance for the capacitive elements provided with the present invention.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1–4c of the drawings, like numerals being used for like and corresponding parts of the various drawings.

Figure 1:
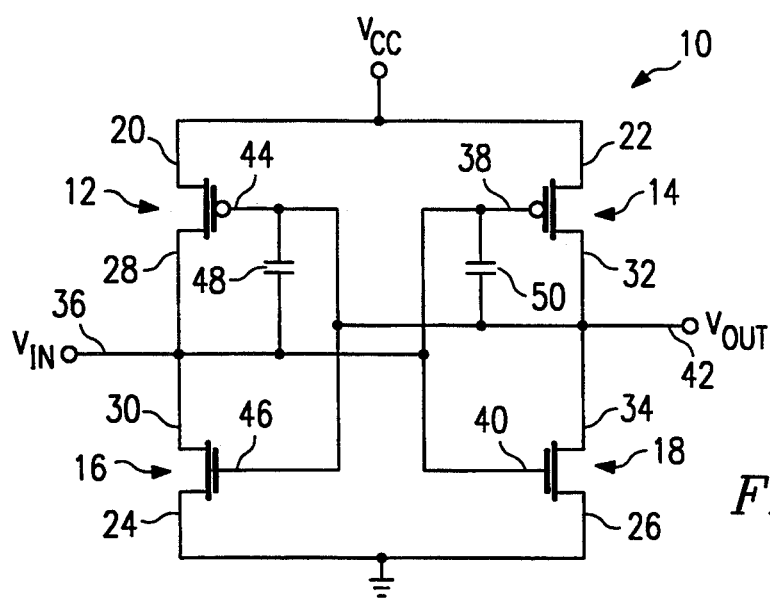
FIG. 1 illustrates a schematic of a latch memory cell having cross-coupled capacitors therein.

FIG. 1 illustrates a schematic view of a latch 10 giving rise to the present invention. Latch 10 comprises generally two pairs of MOS transistors. These transistors include a first and second P channel transistor 12 and 14, and a first and second N channel transistor 16 and 18, respectively. A first source/drain 20 and 22 of both P channel transistors 12 and 14, respectively, are connected to an uppermost supply voltage, $V_{cc}$. Similarly, a first source/drain 24 and 26 of N channel transistors 16 and 18 are connected to a lowermost reference voltage, which is typically ground. The second source/drain 28 of P channel transistor 12 and the second source/drain 30 of N channel transistor 16 are connected. Similarly, the second source/drains 32 and 34 of P channel transistor 14 and N channel transistor 18 are connected.

A digital information may be stored in first node 36 of latch 10. First node 36 is further connected to the gates 38 and 40 of P channel transistor 14 and N channel transistor 18, respectively and to the second source/drain 28 and 30 of transistors 12 and 16. Second node 42 is connected to the gates 44 and 46 of P channel transistor 12 and N channel transistor 16, respectively. Second node 42 stores the converse of the digital information stored at first node 36. Additionally, second node 42 is connected to the second source/drains 32 and 34 of P channel transistor 14 and N channel transistor 18. The interconnection of P channel transistor 12 to n channel transistor 18, and the like connection of N channel transistor 16 to P channel transistor 14 is known in the art as "cross-coupling" of the transistor pairs. A first capacitor 48 is connected between gate 44 of P channel transistor 12 and first node 36. Similarly, a second capacitor 50 is connected between gate 38 of P channel transistor 14 and second node 42.

The operation of latch 10 may be appreciated by tracing an exemplary signal therethrough. For example, where $V_{IN}$ is a digital "1", P channel transistor 14 will be at a high impedance state while N channel transistor 18 will conduct. Accordingly, second node 42 will be connected to ground, thereby yielding a digital "0" as the output. In addition to representing the output signal, this digital "0" will be connected to gates 44 and 46 of P channel transistor 12 and N channel transistor 16. This digital "0" will cause P channel transistor 12 to conduct and N channel transistor 16 to be in a high impedance state. Accordingly, the uppermost supply voltage $V_{cc}$ will conduct to first node 36 and be returned to gates 38 and 40 of P channel transistor 14 and N channel transistor 18. Thus, it may be appreciated that latch 10 is constructed in a regenerative feedback configuration through the network of transistors therein. Accordingly, latch 10 will operate to generally maintain its present state so long as the uppermost voltage $V_{cc}$ remains active.

However, without the addition of capacitors 48 and 50, latch 10 is more susceptible to soft radiation signals. In other words, soft radiation may cause the action of the transistors within latch 10 to fluctuate thereby affecting the otherwise valid signals thereon. Accordingly, capacitors 48 and 50 operate to store the signals within the circuit during any brief time periods where radiation may otherwise have a deleterious effect thereon.

Figure 2:
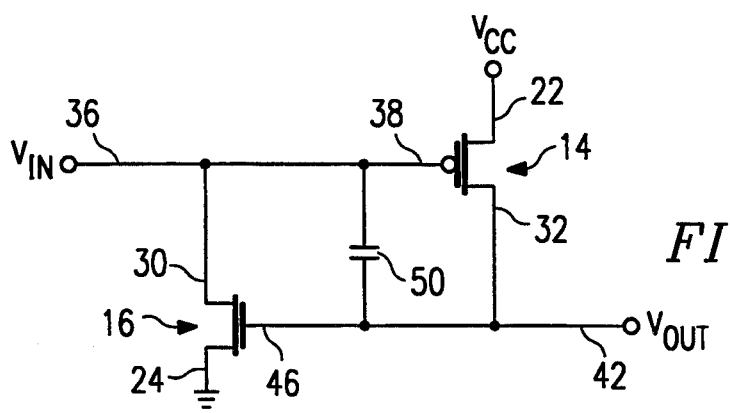
FIG. 2 illustrates a schematic of one pair of the cross-coupled P and N channel transistors of FIG. 1 having a capacitor connected between the gates of both transistors.

FIG. 2 illustrates a schematic view of one of the cross-coupled pairs of transistors of FIG. 1. More particularly, second P channel transistor 14 and first N channel transistor 16 are shown. Similarly, the other common reference numerals from FIG. 1 are shown. The present invention provides a method and particular structure for constructing the schematic of FIG. 2 in a stacked MOS transistor configuration. It is to be understood, however, that first P channel transistor 12 and second N channel transistor 18 may be similarly constructed in the same form as that to be discussed hereinafter. Once each pair of transistors are constructed, they may be interconnected as is necessary according to the schematic of FIG. 1.

Figure 3:
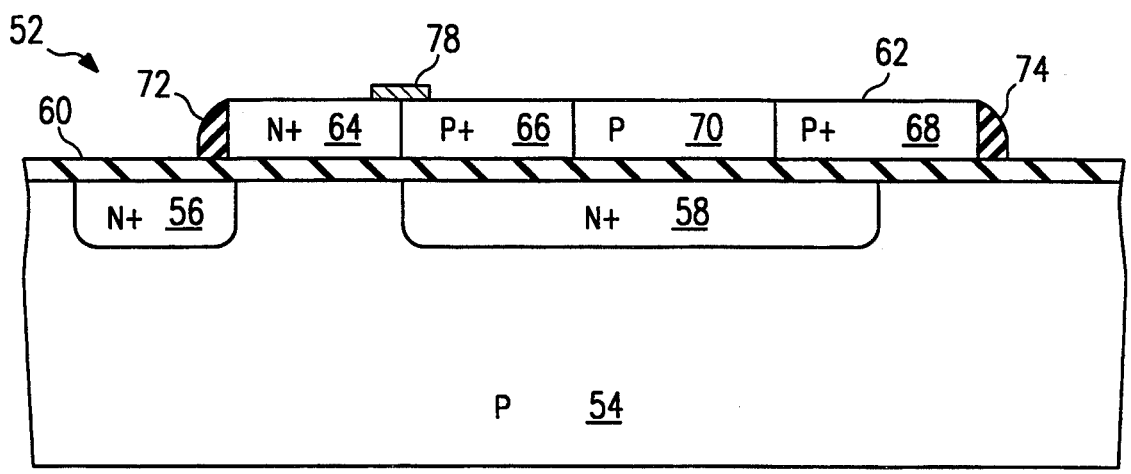
FIG. 3 illustrates a cross-sectional view of a prior art stacked CMOS configuration.

FIG. 3 illustrates a prior art stacked CMOS configuration 52 for effecting the schematic of FIG. 2 without the addition of capacitor 50 as illustrated therein. CMOS configuration 52 includes a semiconductor substrate 54 which is typically formed of a P type semiconductor material. First and second diffused regions 56 and 58, respectively, are formed within semiconductor substrate 54. Both regions 56 and 58 are typically of an N type semiconductor material. More particularly, these regions are doped to an "N+" level, thereby denoting a high dopant concentration on the order of $10^{21}/cm^3$. An insulating layer 60 is formed overlying semiconductor substrate 54. Thereafter, a polysilicon layer 62 is formed above insulating layer 60. Polysilicon layer 62 is masked and doped to include four different regions 64, 66, 68 and 70 therein. A first doped region 64 may be of an N type doping at a high doping level similar to that of diffused regions 56 and 58. A second and a third doped region 66 and 68 are doped with a P type dopant and are also of a high doping concentration level. A fourth doped region 70 is formed between second and third doped regions 66 and 68. Fourth doped region 70 may be of either a P or N type material, but is typically made of a P type material such that the threshold voltage between doped regions 66 and 68 is relatively low. Insulating sidewalls 72 and 74 are formed at the ends of polysilicon layer 62. A conductive strap 78 electrically couples first doped region 64 to second doped region 66.

The correlation of the various regions within FIG. 3 and the schematic of FIG. 2 is as follows. First and second diffused regions 56 and 58 correspond to the first source/drain 24 and second source/drain 30, respectively, of first N channel transistor 16. Thus, first diffused region 56 will be connected to ground in accordance with FIG. 2. First doped region 64 functions as the gate 46 for first N channel transistor 16. Second doped region 66 and third doped region 68 act as the second source/drain 32 and first source/drain 22, respectively, of second P channel transistor 14. Thus, third doped region 68 will be connected to $V_{cc}$ in accordance with FIG. 2. Further, conductive strap 78 connects gate 46 of N channel transistor 16 to second source/drain 32 of P channel transistor 14. Fourth doped region 70 functions as the channel region for P channel transistor 14. Second diffused region 58 functions as the gate 38 for P channel transistor 14. Therefore, second diffused region 58 functions as both the gate 38 for P channel transistor 14 and the second source/drain 30 of N channel transistor 16. It should be noted that fourth doped region 70 may be formed of an N type semiconductor material thereby raising the threshold voltage between first and second doped regions 66 and 68.

The prior art CMOS configuration 52 of FIG. 3 includes no capacitor therein. As a result, this circuit is susceptible to soft radiation errors as noted above. Further, because of the formation of polysilicon layer 62, both N channel transistor 16 and P channel transistor have the same thickness of gate insulator 60 between the gates and channels for each transistor. It should also be noted that first and second diffused regions 56 and 58 are not self-aligned with first doped region 64 which as a gate conductor thereto.

Figure 4A:
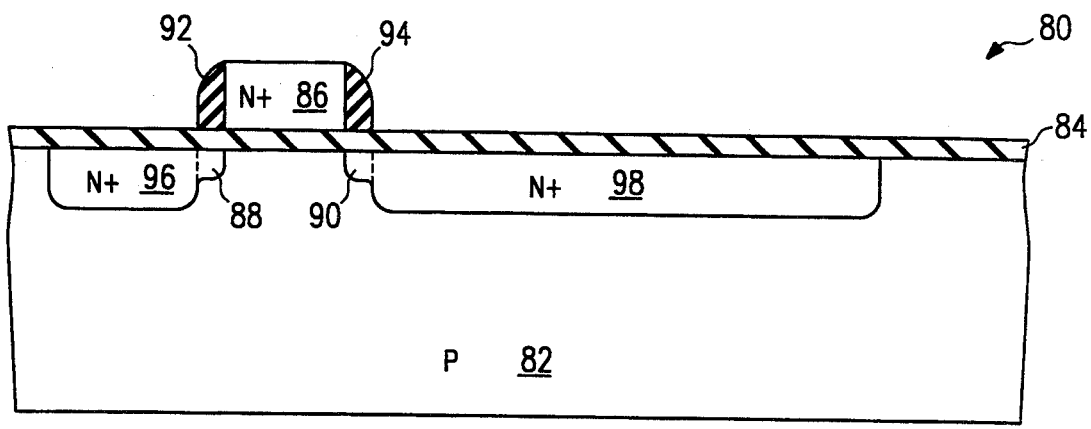
FIG. 4a illustrates a cross-sectional view of an initial processing stage for the preferred stacked configuration of the present invention.
Figure 4B:
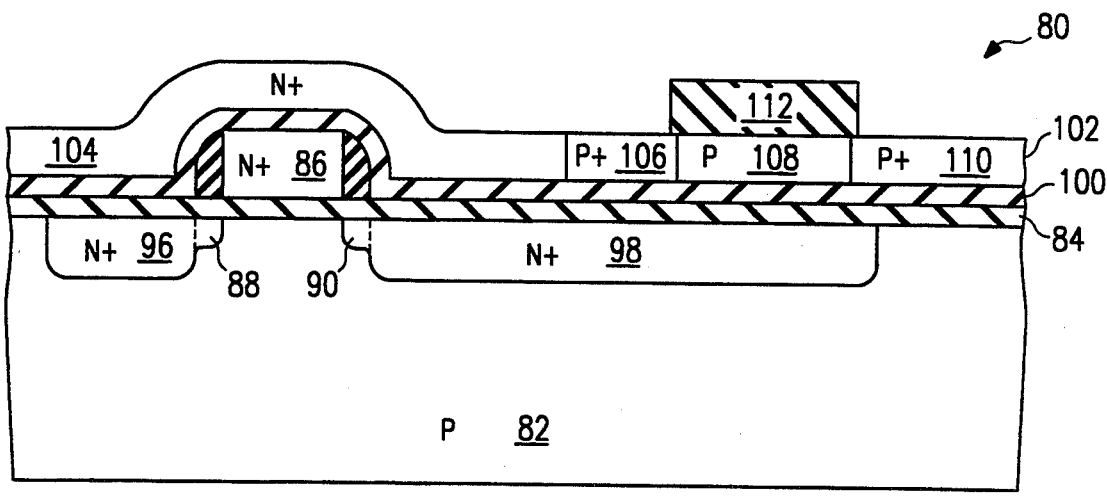
FIG. 4b illustrates a cross sectional view of an intermediate stage in the fabrication of the stacked configuration of the present invention.
Figure 4C:
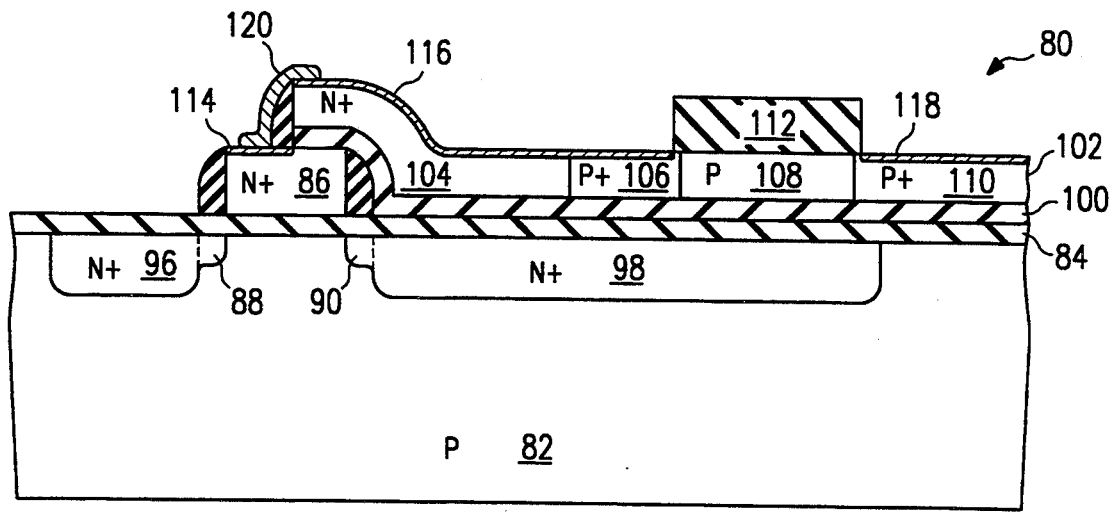
FIG. 4c illustrate a cross-sectional view of the interconnected cross-coupled CMOS transistors of the present invention.

FIGS. 4a–4c illustrates a cross-sectional view of the fabrication of the transistor cell which forms the latch 80 of the present invention. It is again to be noted that while only half of the latch is illustrated, an identical half may be made contemporaneously therewith and connected as shown in FIG. 1.

Latch 80 is formed on a semiconductor substrate 82. An insulating layer 84 is formed over semiconductor substrate 82. Insulating layer 84 may be either a deposited or grown oxide on the order of 120 angstroms in thickness. Thereafter, a gate conductor 86 is formed over insulating layer 84. Gate conductor 86 need only be a conductive material and in the preferred embodiment is composed of a doped polysilicon layer on the order of 2000-3000 angstroms in thickness and patterned to be approximately 0.6 μm in length. Further, the doping of gate conductor 86 may be of an N type semiconductor doping and of an N+ dopant concentration (i.e. on the order of $10^{21}$cm$^3$). After gate conductor 86 is formed by masking and etching the conductive material lightly doped regions 88 and 90 are formed within semiconductor substrate 82 and self-aligned to the sides of gate conductor 86. Typically, lightly doped regions 88 and 90 are doped on the order of $10^{18}$/cm$^3$ and of an N type dopant. Insulating sidewall spacers 92 and 94 are formed at the sides of gate conductor 86. After the formation of sidewall spacers 92 and 94, first and second diffused regions 96 and 98 may be formed within semiconductor substrate 82. In order to construct N channel transistor 16 of FIG. 2, first and second diffused regions 96 and 98 are doped with an N type doping source. Typically, these regions are doped on the order of $10^{21}$/cm$^3$. Thus, the combination of gate conductor 86 and diffused regions 96 and 98 form a bulk N channel transistor within semiconductor substrate 82.

FIG. 4b illustrates a cross-sectional view of a further processing stage in the fabrication of latch 80 of the present invention. A second insulating layer 100 is formed over the entire structure. Insulating layer 100 may be an oxide on the order of 100-200 angstroms in thickness or any other desirable thickness which will affect both the capacitance of the capacitor to be constructed within the circuit and the transistor characteristics of the P channel transistor. It should also be noted that the portion of insulating layer 84 which overlies second diffused region 98 may be removed prior to the formation of second insulating layer 100. Removal of this portion of insulating layer 84 will enhance gate oxide integrity for the P channel transistor.

A semiconductor layer 102 is formed over second insulating layer 100. Typically, semiconductor layer 102 comprises polysilicon on the order of 700-1400 angstroms in thickness. Semiconductor layer 102 is masked and doped to include therein first, second, third and fourth doped regions 104, 106, 108 and 110, respectively. First doped region 104 is typically doped with an N type semiconductor dopant at a level on the order of $10^{21}$/cm$^3$. Second and fourth doped regions 106 and 110 are doped with a P type semiconductor dopant and also are on the order of $10^{21}$/cm$^3$. Third doped region 108 may be doped with either an N or P type dopant source. The selection of dopant source will affect the threshold voltage between second and fourth doped regions 106 and 110. In the preferred embodiment, third doped region 108 is doped with a P type dopant on the order of $5(10)^{16}$ to $1(10)^{17}$/cm$^3$. The utilization of a P type dopant source at this dopant level will provide a lesser threshold voltage between second and fourth doped regions 106 and 110. An insulating mask 112 is formed over third doped region 108.

The structure illustrated in FIG. 4b depicts the components of FIG. 2 but without the interconnections therebetween. First and second diffused regions 96 and 98, along with lightly doped regions 88 and 90 function as the source/drain for N channel transistor 16. Gate conductor 86 functions as the gate for N channel transistor 16. Second diffused region 98 and first doped region 104 function as the plates for capacitor 50. Accordingly, the combination of first insulating layer 84 and second insulating layer 100 therebetween function as a dielectric which contributes to the capacitive value of capacitor 50. Second doped region 106 and fourth doped region 110 function as source/drains 32 and 22, respectively, for P channel transistor 14. Additionally, third doped region 108 functions as a channel area and second diffused region 98 functions as the gate 38 for P channel transistor 14. Thus, second diffused region 98 functions as the second source/drain 30 for N channel transistor 16, one plate of second capacitor 50 and the gate 38 for P channel transistor 14.

FIG. 4c illustrates a cross-sectional view of latch 80 having the final connections made therein to effect the circuit depicted in FIG. 2. Subsequent to the formation of mask region 112, latch 80 is exposed to a silicide process such that silicide regions 114, 116 and 118 are formed. Mask region 112 prevents a silicide film from being formed over third doped region 108. Silicide regions 114, 116 and 118 provide a means by which electrical contact may be made to the components adjacent the silicide. Further, silicide region 116 electrically couples first doped region 104 to second doped region 106. This connection correlates to the connection of capacitor 50 to second source/drain 32 of P channel transistor 14. Subsequent to the formation of the silicide regions, a strap contact 120 is formed between silicide regions 114 and 116. Strap contact 120 has the effect of electrically coupling capacitor 50 to gate 46 of N channel transistor 16.

Voltage and signal connections will also be made in accordance with FIG. 2. For example, first diffused region 96 will be connected to ground. Similarly, fourth doped region 110 will be connected to $V_{cc}$. First node 36 may be contacted by connecting to second diffused region 98. Second node 42 may be contacted by connecting to silicide region 116. It is also to be understood that the bulk and stacked transistors may be formed of the opposite conductivity types than discussed herein. Thus, the bulk transistor may be constructed as a P channel transistor while the stacked transistor comprises an N channel transistor.

The present invention therefore provides a method and structure including a stacked latch having a capacitor connected between the gates of associated cross-coupled P and N channel transistors. The capacitor alleviates the effects of exposure to soft radiation and is constructed in a stacked manner to conform to the stacked technology for the remainder of the circuit. The independent P and N channel transistors within the cell are constructed such that a different gate oxide thickness may be formed for each independent transistor. The independence of gate insulators gives rise to the adjustability of the capacitance associated with the cross-coupled capacitor. Finally, the formation of the gate conductor for the N channel transistor independent of the formation of the P channel transistor permits self-alignment between the gate and the source/drain regions of the N channel transistor.

Although the present invention has been described in detail, it should be understood that various changes, substitutions and alterations can be made herein without departing from the spirit and scope of the invention as defined by the appended claims.

What is claimed is:
1. A SRAM comprising:
   a bulk transitisor having a gate;

a stacked transistor having a gate and first and second source/drain regions; and a discrete first capacitor plate located between said gate of said bulk transistor and said first source/drain region of said stacked transistor;

wherein said gate of said stacked transistor comprises a first diffused region, said first diffused region also forming a first source/drain region of said bulk transistor and a second capacitor plate.

2. The SRAM of claim 1, wherein said bulk transistor is of a first conductivity type and said stacked transistor is of a second conductivity type opposite said first conductivity type.

3. The SRAM of claim 2, wherein said first and second capacitor plates comprises said first conductivity type.

4. The SRAM of claim 1, wherein said bulk transistor is located in a semiconductor substrate and further comprises:

a second diffused region located within said semiconductor substrate; and a first insulator layer located between said gate of said bulk transistor and said semiconductor substrate.

5. The SRAM of claim 4, wherein said first insulator layer is also located between said first and second capacitor plates.

6. The SRAM of claim 5 further comprising a second insulator layer located between said first capacitor plate and said first insulator layer.

7. The SRAM of claim 6, wherein said first and second insulator layers are also located between said gate of said stacked transistor and said first and second source/drain regions of said stacked transistor.

8. The SRAM of claim 4, further comprising first and second lightly doped regions located adjacent said first and second diffused regions, said first and second lightly doped regions being self-aligned to said gate of said bulk transistor.

9. The SRAM of claim 1, wherein said first and second source/drain regions of said stacked transistor comprises a semiconductor layer separated from said first diffused region by an insulator layer, said semiconductor layer also comprising a channel region located between said first and second source/drain regions of said stacked transistor.

10. The SRAM of claim 9, wherein said channel region and said first and second source/drain regions of said stacked transistor comprise a first conductivity type dopant.

* * * * *